US005896057A

United States Patent [19]
Chicca et al.

[11] Patent Number: 5,896,057
[45] Date of Patent: Apr. 20, 1999

[54] DIAGNOSTIC POWER DRIVER CIRCUIT

[75] Inventors: Stefania Chicca; Vanni Poletto, both of Cornaredo; Marco Morelli, Leghorn, all of Italy

[73] Assignee: SGS-THOMSON Microelectronics S.r.l., Agrate Brianza, Italy

[21] Appl. No.: 08/865,721

[22] Filed: May 30, 1997

[30] Foreign Application Priority Data

May 31, 1996 [EP] European Pat. Off. ............ 96830309

[51] Int. Cl.⁶ .................................................. H03K 17/56
[52] U.S. Cl. .......................... 327/423; 327/424; 318/434
[58] Field of Search .................................. 327/423, 424, 327/427, 431, 434, 437, 588; 318/434, 811; 363/56

[56] References Cited

U.S. PATENT DOCUMENTS

| 5,111,123 | 5/1992 | Hach et al. ............................... 318/434 |
| 5,457,364 | 10/1995 | Bilotti et al. ............................ 318/434 |
| 5,703,490 | 12/1997 | Kennedy ................................. 324/650 |

FOREIGN PATENT DOCUMENTS

| 0 525 522 | 2/1993 | European Pat. Off. . |
| 0 589 797 | 3/1994 | European Pat. Off. . |
| 0 692 864 | 1/1996 | European Pat. Off. . |
| 2 680 007 | 2/1993 | France . |
| 2 696 252 | 4/1994 | France . |
| 40 30 533 | 4/1992 | Germany . |
| WO 88/00770 | 1/1988 | WIPO . |

Primary Examiner—Tuan T. Lam
Attorney, Agent, or Firm—Jenkens & Gilchrist

[57] ABSTRACT

A troubleshooting circuit for locating malfunctions while driving an electric load by means of a bridge stage (M1, M2, M3, M4) which is connected between ground (GND) and the power supply (+VCC) in series with first and second resistors (Rsl, Rsh), respectively. First (COMP1) and second (COMP2) threshold comparators are coupled to the first resistor to sense a short-circuit to battery (+VCC) and an open-load condition, respectively. Coupled to the second resistor is a third threshold comparator (COMP3) adapted to sense a short-circuit to ground. The output signals from the comparators are sampled through flip-flops (FF1, FF2, FF3, FF4, FF5, FF6) upon a transistor in the bridge being switched to the off state.

4 Claims, 2 Drawing Sheets

| FF1 FF2 FF3 / FF4 FF5 FF6 | 000 | 001 | 010 | 100 | 110 | 101 | 011 | 111 |
|---|---|---|---|---|---|---|---|---|
| 000 | 0000 | 0001 | 1000 | 1000 | 1000 | – | 1000 | – |
| 001 | 0100 | 0100 | 0010 | – | 0010 | – | 0010 | – |
| 010 | 0010 | 0100 | 1000 | 0010 | 0010 | – | – | – |
| 100 | 0100 | 0010 | – | 1000 | – | – | – | – |
| 110 | 0100 | 0100 | – | 0010 | – | – | – | – |
| 101 | 0100 | 0100 | 0010 | 0100 | – | – | – | – |
| 011 | 0100 | 0100 | – | 0010 | 0010 | – | 0010 | – |
| 111 | 0100 | 0100 | – | 0010 | – | – | – | – |

*FIG. 2*

DIAGNOSTIC POWER DRIVER CIRCUIT

TECHNICAL FIELD OF THE INVENTION

The present invention relates to electrical power driver circuits, and more particularly to power driver circuits having malfunction detection and location capability.

BACKGROUND OF THE INVENTION

Widely utilized in the automotive field are diagnostics decoders for troubleshooting electrical or electronic units. These are aimed at obtaining as much detailed information as possible about malfunctions occurring within a unit, and this demand does bear on the individual electronic devices provided in the unit.

Accordingly, it would be useful, especially where the ratio of new functionality-to-silicon area of an integrated circuit chip, is an advantageous one, if the individual devices can be provided with full self-diagnosis capabilities. This would simplify the program software of the vehicle microprocessor, relieving it, in the instance of a bridge type of driver circuit, of the need to have the diagnostics "word" read at each of the two drive steps, if an information about short-circuit trouble is to be issued in detail.

The internal diagnostic information of the device can be stored; the storage operation may be carried out concurrently upon sensing a possible malfunction if an alarm terminal to the microprocessor is provided (in which case, a malfunction read out to the microcontroller would be the one sensed first), or alternatively, be triggered by a request for the diagnostics "word" from the microprocessor, where the alarm pin is not there (in which case, a malfunction read out to the microprocessor would be the one sensed last).

Almost all of the current bridge-type drive devices provide diagnostics for short-circuits to the battery, short-circuits to ground, and an open load, but not for short-circuits across the load.

There exist two methods which are more frequently employed to provide such diagnostics, as follows:

1. Short-circuits to the battery and to ground are located by means of two comparators, which compare the voltage drop across resistive elements through which the load current is flowed with a reference threshold. The short-circuit diagnostic procedure is triggered by this threshold being overtaken. The open-load condition is provided by a comparator comparing the drop across a resistive element through which the load current is flowing with a reference threshold, the open-load diagnostics being triggered after the open-load condition has been sensed through a predetermined time period in some cases synchronized to the drive phases (the diagnostics would be invalid during the time periods when the bridge is disabled because such time periods are usually utilized to cancel it out.

2. Shorts to the battery or to ground are again located by the above method, but the short-circuit diagnostics is only triggered on after the reference threshold has been overtaken through a definite time period. This filtering interval, during which a current limiter circuit may be operated, is necessary to avoid any disturbance having to be taken account of, especially during the switchover phases when cross conduction may occur due to either a malfunction in the non-overlap intervals or to a delay in turning off the power transistors of the bridge. The filtering interval allows the shorted-load condition to be ascertained, which condition would be encoded, however, as a generic abnormal event. The open-load condition would only be sensed with the bridge disabled; accordingly, it can only be ascertained by forcing the microprocessor to periodically disable the driver circuit. In addition, no filtering of any kind is applied to that information, so that any disturbance to the open-load sensing would propagate asynchronously through the diagnostics. A device which utilizes this method is a TLE5203 chip marketed by Siemens.

SUMMARY OF THE INVENTION

Accordingly, a power drive circuit includes full diagnostic function (open load, short to ground, short to the battery, short across the load) while in operating mode under an electrical load.

The features and advantages of a circuit according to the invention can be best appreciated from the detailed description that follows of an embodiment thereof, given by way of non-limitative example with reference to the accompanying drawings.

BRIEF DESCRIPTION OF THE DRAWINGS

FIG. 2 shows a table of possible diagnostics at the output stages of flip-flops included in the circuit layout of FIG. 1.

DETAILED DESCRIPTION OF A PREFERRED EMBODIMENT OF THE PRESENT INVENTION

Figure 1:
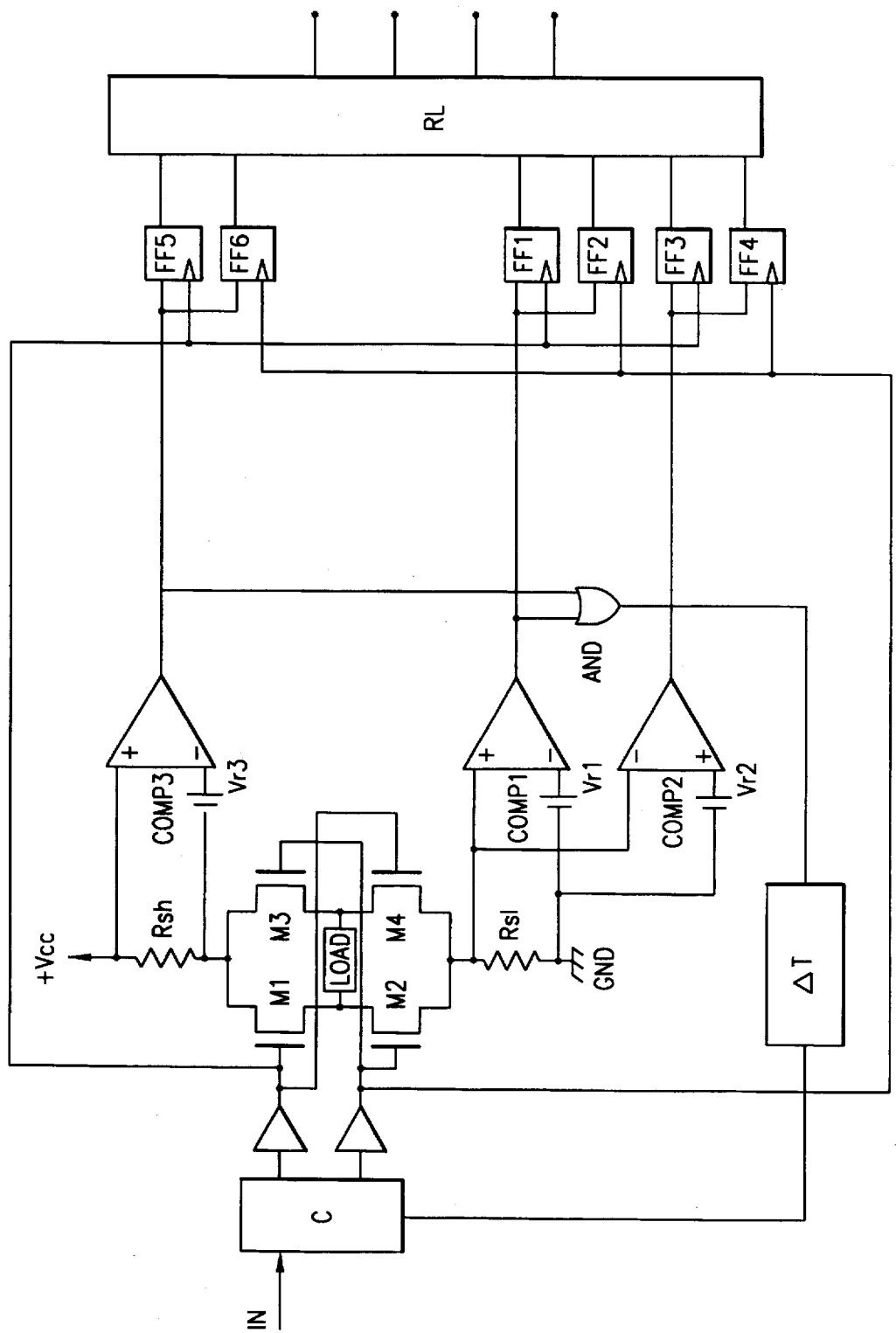
FIG. 1 illustrates a driver stage for an electric load, incorporating a troubleshooting circuit according to the invention.

The circuit, according to the present invention, shown in FIG. 1 provides a driver stage of the bridge type which comprises four field-effect transistors M1, M2, M3 and M4, connected in the bridge legs.

A load LOAD is connected between two opposed apex points of the bridge, which bridge is connected with its two other opposed apices between a ground GND and a power supply line +Vcc, respectively through a resistor Rsl and a resistor Rsh.

A control circuit C has a drive signal input terminal IN, a first output terminal connected to the gate terminals of the two opposed transistors M1 and M4, and a second output terminal connected to the gate terminals of the two other opposed transistors M2 and M3.

The two pairs of opposed transistors are driven essentially in phase opposition.

For sensing malfunctions, i.e., short-circuit or open-load conditions as previously mentioned, the circuit construction includes three preset threshold comparators COMP1, COMP2 and COMP3, each having first "+" and second "−" input terminals and an output terminal.

The resistor Rsl is connected to both the input terminals of COMP1 and the input terminals of COMP2, while the resistor Rsh is connected to the input terminals of COMP3.

The comparators are arranged to compare the values of the currents being flowed through the two resistors with reference currents that establish the abnormal event reference threshold.

According to the invention, the outputs of these comparators are sampled each time that an active element, i.e. one of the transistors M1, M2, M3 and M4, in the bridge is turned off. The turning off can either be controlled by the input drive signal or an internal current protection signal.

For the purpose, in the circuit construction of FIG. 1, a logic AND gate is connected to the output terminals of COMP1 and COMP3 which can supply, via the control circuit C, a signal effective to turn off the bridge elements, in a timed fashion following a time interval ΔT.

This can be accomplished, in a known manner to those skilled in the art, for example, by having a state machine connected in the control block C which is operative to store the turn-off signal for a predetermined time period, the signal being then removed upon the bridge being turned off.

The comparator COMP2 senses the open-load condition when the current through the resistor Rsl is below a predetermined current value, which value is selected to be very low.

The circuit, embodying the present invention, includes six flip-flops, or bistable multivibrator circuits, FF1, FF2, FF3, FF4, FF5 and FF6, each having a signal input terminal generated by a comparator and a control terminal for transferring the signal to an output terminal.

Connected to the output terminal of each comparator are the input terminals of one flip-flop pair.

The control terminal of one flip-flop in each pair is connected to the first output terminal of control circuit C, with the control terminal of the other flip-flop in the pair being connected to the second terminal of the control block.

In this way, the output signals from the comparators are sampled because the transfer of signals through the flip-flops can only take place upon the bridge transistors being driven to switch over from the control circuit C.

For the purpose of providing a diagnostic function, the outputs from the flip-flops could be used directly, but in the preferred embodiment of the circuit, the flip-flops are connected to the inputs of a logic network RL, of a combinational type, which has four output terminals for reporting the four types of failures previously mentioned.

The logic network can be implemented in a variety of ways, as those skilled in the art will readily recognize.

FIG. 2 shows how the troubleshooting procedure can be associated with the state of the outputs of the various flip-flops, wherein:

FF1=1 means that a short to the battery has been found on M4;

FF2=1 means that the short to the battery has been found on M2;

FF3=1 means that an open-load condition has been found on M4;

FF4=1 means that the open-load has been found on M2;

FF5=1 means that a short to ground has been found on M1;

FF6=1 means that the short to ground has been found on M3.

The minus sign denotes an impossible configuration in the diagnostics process.

Shown inside the boxes are the states of the outputs of the combinational network RL, namely, from left to right, the diagnostics for shorts to the battery, shorts to ground, shorts across the load, and open load.

The current protection signal is active if the output of one of the short-circuit diagnostics comparators has been high throughout the filtering interval ΔT. As said before, an activation of the current protection signal would result in all of the load drive transistors being disabled until the next input signal is switched over.

Sampling the outputs involves a full troubleshooting procedure.

Troubleshooting for shorts across the load can be accomplished by an AND logic processing between diagnostics procedures for shorts to the battery and shorts to ground, because the filtering time ΔT is longer than the relative operation delay of the two diagnostics comparators for shorts to ground and shorts to the battery.

The storage flip-flops may be of the type known to the skilled ones as "positive D—edge triggered" type. The diagnostics data is retained therein throughout the period of the input signal, and then updated.

It matters to observe that the troubleshooting circuit arrangement of this invention is specially suitable for use in automotive applications, e.g. at the interface between the butterfly valve motor and the microprocessor in the control unit, but it could also be used on other vehicles, including boats and airplanes.

Also, as a troubleshooting arrangement for a bridge-type driver, it could be used in any applications of this type of driver stage, such as in computer peripheral units.

It should be understood that many modifications or integrations may be made unto the exemplary embodiment just described without departing from the protection scope of the appended claims, which modifications and integrations would be well within the capabilities of a skilled person in the art.

In particular, the same troubleshooting arrangement could be used with a "half-bridge" driver stage, i.e. a driver stage consisting of just the transistors M1 and M2 in the diagram of FIG. 1.

The diagram of FIG. 1 contains the basic diagnostics elements, but in practicing the invention, the resistors Rsh and Rsl could be duplicated to provide, again between +VCC and GND, a resistor pair for each of the two legs containing the transistors M1, M2 and M3, M4.

In this case, one comparator would be respectively used for each of the six flip-flops, so that the number of the comparators would be twice as many.

As for the comparator COMP2 shown in FIG. 1, its input terminals could be connected across the series connection of Rsl to the transistor M2, i.e. with the plus input of the comparator COMP2 connected to the load LOAD, rather than being connected across the resistor Rsl alone.

In either cases, COMP2 would perform a diagnostic function for open load.

One viable circuit uses D-latch flip-flops. The failure information is here retained during one half-period of the input signal and canceled during the other. A possible shortcoming of the last-mentioned approach is that, on the occurrence of a persistent short across the load, the short-circuit information during the filtering period ΔT would be canceled.

In conclusion, the updating of the troubleshooting procedure in this invention, being performed synchronously with each switching of the bridge transistors from the on state to the off state, provides the following advantages over prior solutions:

1. It allows the diagnostics for a shorted load, in the instance of a bridge, to be obtained as a logic AND between the diagnostics for shorts to the battery and the diagnostics for shorts to ground, that is at a high ratio of functionality to area of integration silicon;

2. It always provides correct diagnostics, in the instance of a bridge, whether it is driven by controlling an input IN or driven from an enable terminal of the control block C, not shown in FIG. 1.

3. The open load diagnostics for a non-continuously driven load is obtained at a lower cost than before, since the whole power-up period of the drive transistor is taken as the filtering period for that information;

silicon area (capacitance) for providing sufficiently long (hundreds of microseconds) filtering periods to reject any noise associated with the load can, therefore, be saved.

What is claimed is:

1. A circuit, for locating and identifying malfunctions occurring during operation of an electric load, comprising:

a bridge circuit having first and second branches, said each branch comprising at least first and second transistors connected in series, each having a control terminal and first and second terminals; first and second current sensing elements, connected in series respectively between one of said first and second terminals of one of said transistors of each branch and a common potential node and a voltage supply node, said electric load being in between a connection node between the first and second transistors of each branch;

a control circuit, having at least one switch signal input, a control terminal, and first and second output terminals connected to the control terminals of the first and second transistors of each branch respectively, for driving the first and second transistors at non-overlapping phases;

a plurality of comparator circuits, comprising a first comparator circuit, a second comparator circuit, and a third comparator circuit, each comparator circuit having first and second input terminals, the first current sensing element being coupled to the first input terminal of said first comparator circuit and the first input terminal of a second comparator circuit, and the second current sensing element being coupled to the first input terminal of said third comparator circuit, the second input terminals of said first, second, and third comparator circuits coupled to a respective voltage; and a plurality of bistable circuits, each having an input terminal, control terminal and output terminal, the input terminals of a first and a second bistable circuit bistable circuit being connected to the output terminal of the first comparator circuit, the input terminals of a third and a fourth bistable circuit being connected to the output terminal of the second comparator circuit, the input terminals of a fifth and a sixth bistable circuit being connected to the output terminal of the third comparator circuit, the control terminals of the first, third, and fifth bistable circuit being coupled to the first output terminal of the control circuit, and the control terminals of the second, fourth, and sixth bistable circuit being coupled to the second output terminal of the control circuit, the output terminals of the bistable circuits providing malfunction data.

2. A circuit according to claim 1, further comprising:

a logic network, having inputs connected to the output terminals of the bistable circuits and performing logic operations on output signals therefrom, and having output terminals for outputting diagnostics information.

3. A circuit according to claim 1, further comprising:

an AND circuit for gating the outputs of the first and third comparator circuits; and a preset delay network, connected to an output of said AND circuit and to the control terminal of the control circuit.

4. A circuit according to claim 3, wherein the control circuit comprises a state machine, the state machine being actuated through the control terminal of the control circuit and de-actuated upon an input signal at the switch signal input of the control circuit.

* * * * *